United States Patent [19]

Strohacker

[11] Patent Number: 5,659,755
[45] Date of Patent: Aug. 19, 1997

[54] METHOD AND SYSTEM IN A DATA PROCESSING SYSTEM FOR EFFICIENTLY COMPRESSING DATA USING A SORTING NETWORK

[75] Inventor: Oscar Conrad Strohacker, Dripping Springs, Tex.

[73] Assignee: International Business Machines Corporation, Armonk, N.Y.

[21] Appl. No.: 559,673

[22] Filed: Nov. 20, 1995

[51] Int. Cl.⁶ .............................. G06F 17/30; H03M 7/30
[52] U.S. Cl. ...................... 364/715.02; 395/612; 341/51
[58] Field of Search ........................ 395/114, 715.02, 395/888; 341/51, 55, 70

[56] References Cited

U.S. PATENT DOCUMENTS

| | | | |
|---|---|---|---|
| 4,630,300 | 12/1986 | Kang et al. | 381/31 |
| 4,922,537 | 5/1990 | Frederiksen | 381/31 |
| 4,951,138 | 8/1990 | Henot | 358/133 |
| 5,003,307 | 3/1991 | Whiting et al. | 341/51 |
| 5,055,919 | 10/1991 | Klein et al. | 358/261.1 |
| 5,179,378 | 1/1993 | Ranganathan et al. | 341/51 |
| 5,245,337 | 9/1993 | Bugajski et al. | 341/51 |
| 5,329,405 | 7/1994 | Hou et al. | 395/800 |
| 5,369,605 | 11/1994 | Parks | 364/715.09 |
| 5,426,779 | 6/1995 | Chambers, IV | 395/612 |
| 5,488,365 | 1/1996 | Seroussi et al. | 341/51 |
| 5,532,694 | 7/1996 | Mayers et al. | 341/67 |

OTHER PUBLICATIONS

"Gigabit Networking" by Craig Partridge, copyright 1994 by Addison–Wesley Publishing Company, pp. 113–116.

"Sorting networks and their applications" by K.E. Batcher; Goodyear Aerospace Corporation, Akron, Ohio (Spring Joint Computer Conference, 1968), pp. 307–114.

"The Art of Computer Programming" by Donald E. Knuth, vol. 3/Sorting and Searching, Addison–Wesley Series in Computer Science and Information Processing, copyright 1973, pp. 111–114 and pp. 220–243.

"Optical Computing, A Survey for Computer Scientists" by Dror G. Feitelson, copyright 1988, pp. 57–83.

*Primary Examiner*—John C. Loomis
*Attorney, Agent, or Firm*—Casimer K. Salys; Andrew J. Dillon

[57] ABSTRACT

In a data processing system, a block of N bytes is selected, wherein N is greater than one. Thereafter, a group of N data cells is created wherein each cell has a physical tag for indicating a physical order in the group and a substring that includes a sequence of bytes from the block of N bytes. Next, the group of N cells is sorted lexically to establish a lexical order based upon the lexical value of the substring in each of the N cells. Matching strings in the substrings of selected ones of the N cells are identified in the lexically sorted group of N cells. Thereafter, the block of N bytes is encoded utilizing the identified matching strings to produce a compressed data set, wherein the compressed data set is efficiently produced by identifying redundant information in the lexically sorted group of N cells. Such encoding may be accomplished by comparing lexically adjacent cells in the lexically sorted group of N cells to identify matching strings.

22 Claims, 8 Drawing Sheets

```
set physical tag, P, = 0                                              Output
select cell(0)
      select from lexically preceeding cell, cell(6), and
      lexically succeeding cell, n/a, the valid cell having longest
      matching sequence that physically precedes cell(0).

compare cell(n/a) to selected cell:
            no match
                  output raw token = byte 0 of cell(0)     ─────────▶
      P = P + 1; select next cell                                      r(c)

select cell(1)
      select from lexically preceeding cell, cell(7), and
      lexically succeeding cell, cell(6), the valid cell having longest
      matching sequence that physically precedes cell(1).

compare cell(n/a) to selected cell:
            no match
                  output raw token = byte 0 of cell(1)     ─────────▶
      P = P + 1; select next cell                                      r(b)

select cell(2)
      select from lexically preceeding cell, cell(n/a), and
      lexically succeeding cell, cell(3), the valid cell having longest
      matching sequence that physically precedes cell(2).

compare cell(n/a) to selected cell:
            no match
                  output raw token = byte 0 of cell(2)     ─────────▶
      P = P + 1; select next cell                                      r(a)

select cell(3)
      select from lexically preceeding cell, cell(2), and
      lexically succeeding cell, cell(4), the valid cell having longest
      matching sequence that physically precedes cell(3).

compare cell(2) to selected cell:
            match
                  longest match is string at physical index 2 with length 3
                  output compressed token = index 2, length 3  ──▶
      P = P + 3; select next cell                                c(2,3)='aaa' select cell(6)
      select from lexically preceeding cell, cell(1), and
      lexically succeeding cell, cell(0), the valid cell having longest
      matching sequence that physically precedes cell(6).

compare cell(0) to selected cell:
            match
                  longest match is string at physical index 0 with length 2
                  output compressed token = index 0, length 2  ──▶
                                                             c(0,2)='cb'
```

*Fig. 6*

METHOD AND SYSTEM IN A DATA PROCESSING SYSTEM FOR EFFICIENTLY COMPRESSING DATA USING A SORTING NETWORK

BACKGROUND OF THE INVENTION

1. Technical Field

The present invention relates in general to an improved data processing system, and in particular to an improved method and system for compressing data. Still more particularly, the present invention relates to an improved method and system for compressing a block of data using a sorting network.

2. Description of the Related Art

Sliding window lossless data compression was originally described in 1977 in an article entitled "*A Universal Algorithm for Sequential Data Compression*," by Ziv and Lempel, in IEEE Transactions on Information Theory, 1977. The principle has been described succinctly as "dictionary based compression using previously seen text as the dictionary."

Data compression algorithms may conceptually be divided into two parts: a front-end, data modeling part; and a back-end, output coding part. A primary function of the front-end or data modeling phase of data compression systems—especially LZ based data compression systems—is to locate identical runs or strings of input bytes in the input data.

Efficient hardware for performing such a front-end task in a sliding window, data compression system has been invented by Craft, and is described in U.S. patent application Ser. No. 08/290,451 entitled "*Method and Apparatus for Compressing Data.*" The Craft invention uses a content addressable memory (CAM) with a rotating selector bit register. In U.S. Pat. No. 5,003,307 to Whiting, et al. entitled "*Data Compression Apparatus With Shift Register Search Means,*" a similar approach using a content addressable shift-register is disclosed. The Craft invention can process a byte per cycle, with few gate delays, which is as fast as the data can be delivered to the compression engine in a stream compression paradigm. However, data in computer systems is often available for compression as a block of data, as opposed to a stream of bytes. For example, in data processing systems, fixed-size disk blocks of 4,096 bytes are submitted to a compression engine for compression and decompression at the same time.

Sorting networks, such as those described in "*Sorting Networks and Their Applications*" by K. E. Batcher, in Proceedings AFIPS Spring Joint Conference, Volume 32, pages 307-314, are used in switching systems to route a large number of addressed packets, all of which arrive at the switch at the same time in parallel, to a number of output ports. For data compression implemented in software, sorting based approaches are inferior to hashing based approaches because they take $O(n \log^2(n))$ steps.

Therefore, there remains a need for a method and system that can quickly and efficiently compress a block of data while maximizing the amount of data processing that may be performed in parallel.

SUMMARY OF THE INVENTION

It is therefore one object of the present invention to provide an improved data processing system.

It is another object of the present invention to provide an improved method and system for compressing data.

It is yet another object of the present invention to provide an improved method and system for compressing a block of data using a sorting network.

The foregoing objects are achieved as is now described. In a data processing system, a block of N bytes is selected, wherein N is greater than one. Thereafter, a group of N data cells is created wherein each cell has a physical tag for indicating a physical order in the group, and a substring that includes a sequence of bytes selected from the block of N bytes. Next, the group of N cells is sorted lexically to establish a lexical order based upon the lexical value of the substring in each of the N cells. Thereafter, matching strings in the substrings of selected ones of the N cells are identified in the lexically sorted group of N cells. The block of N bytes is then encoded utilizing the identified matching strings to produce a compressed data set, wherein the compressed data set is efficiently produced by identifying redundant information in the lexically sorted group of N cells. Such encoding may be accomplished by comparing lexically adjacent cells in the lexically sorted group of N cells to identify the matching strings.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

FIG. 6 shows pseudocode for encoding a block of data in accordance with the method and system of the present invention;

DETAILED DESCRIPTION OF THE PREFERRED EMBODIMENT

Figure 1:
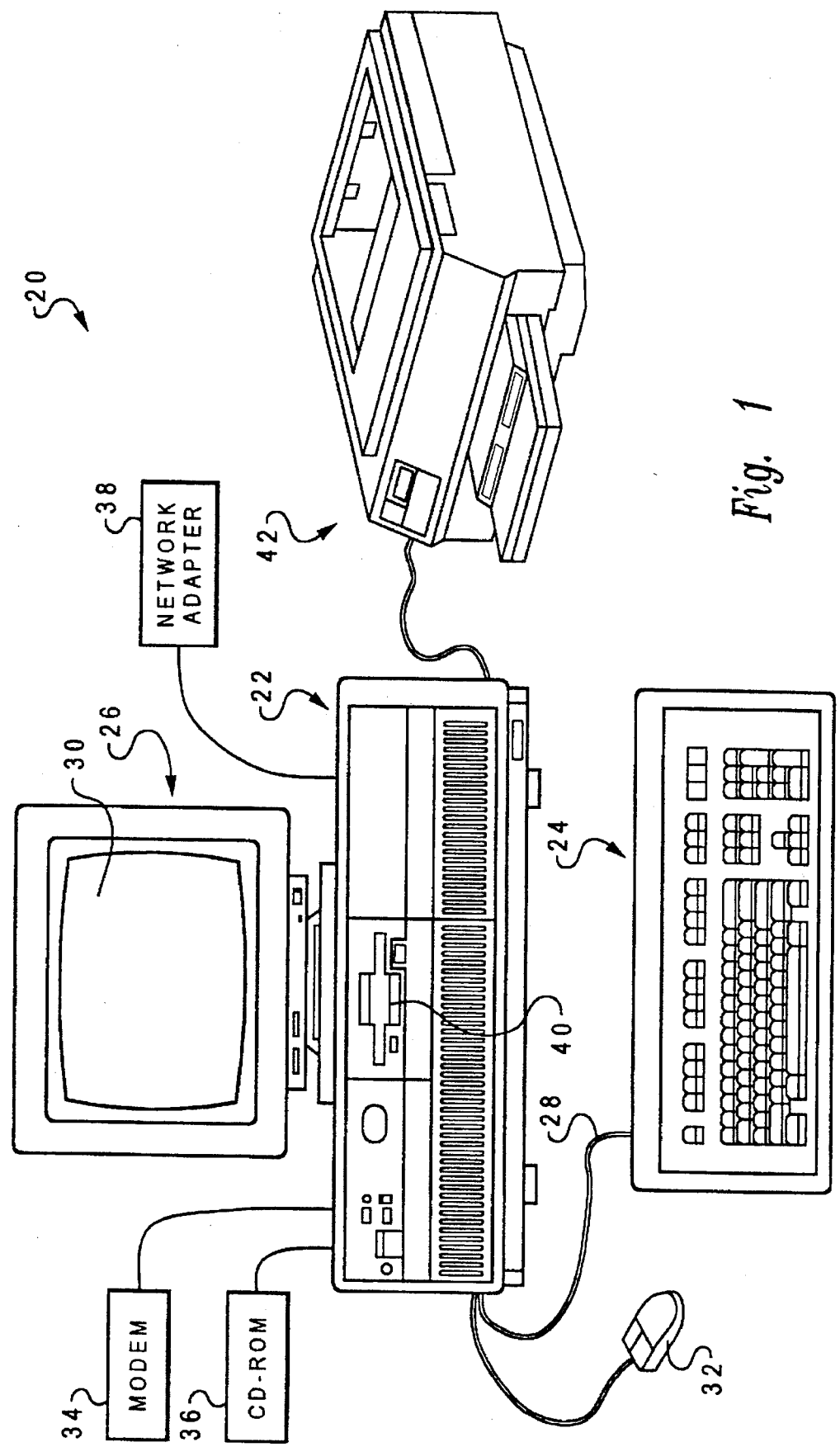
FIG. 1 depicts a data processing system in accordance with the method and system of the present invention.

With reference now to the figures, and in particular to FIG. 1, there is depicted a data processing system 20, which includes processor 22, keyboard 24, and display 26. Keyboard 24 is coupled to processor 22 by a cable 28. Display 26 includes display screen 30, which may be implemented utilizing a cathode ray tube (CRT), a liquid crystal display (LCD), an electroluminescent panel, or the like. Data processing system 20 also includes pointing device 32, which may be implemented utilizing a track ball, joystick, touch sensitive tablet or screen, trackpad, or as illustrated in FIG. 1, a mouse. Pointing device 32 may be utilized to move a pointer or cursor on display screen 30. Processor 22 may also be coupled to one or more peripheral devices, such as modem 34, CD-ROM 36, network adaptor 38 and floppy disk drive 40, each of which may be internal or external to the enclosure of processor 22. An output device such as printer 42 may also be coupled to processor 22.

Those persons skilled in the art of data processing system design should recognize that display 26, keyboard 24, and pointing device 32 may each be implemented utilizing any one of several known off-the-shelf components. Data processing system 20 may be implemented utilizing any general purpose computer or so-called personal computer, such as the personal computer sold under the trademark "PS/2" by International Business Machines Corporation (IBM), of Armonk, N.Y.

Figure 2:
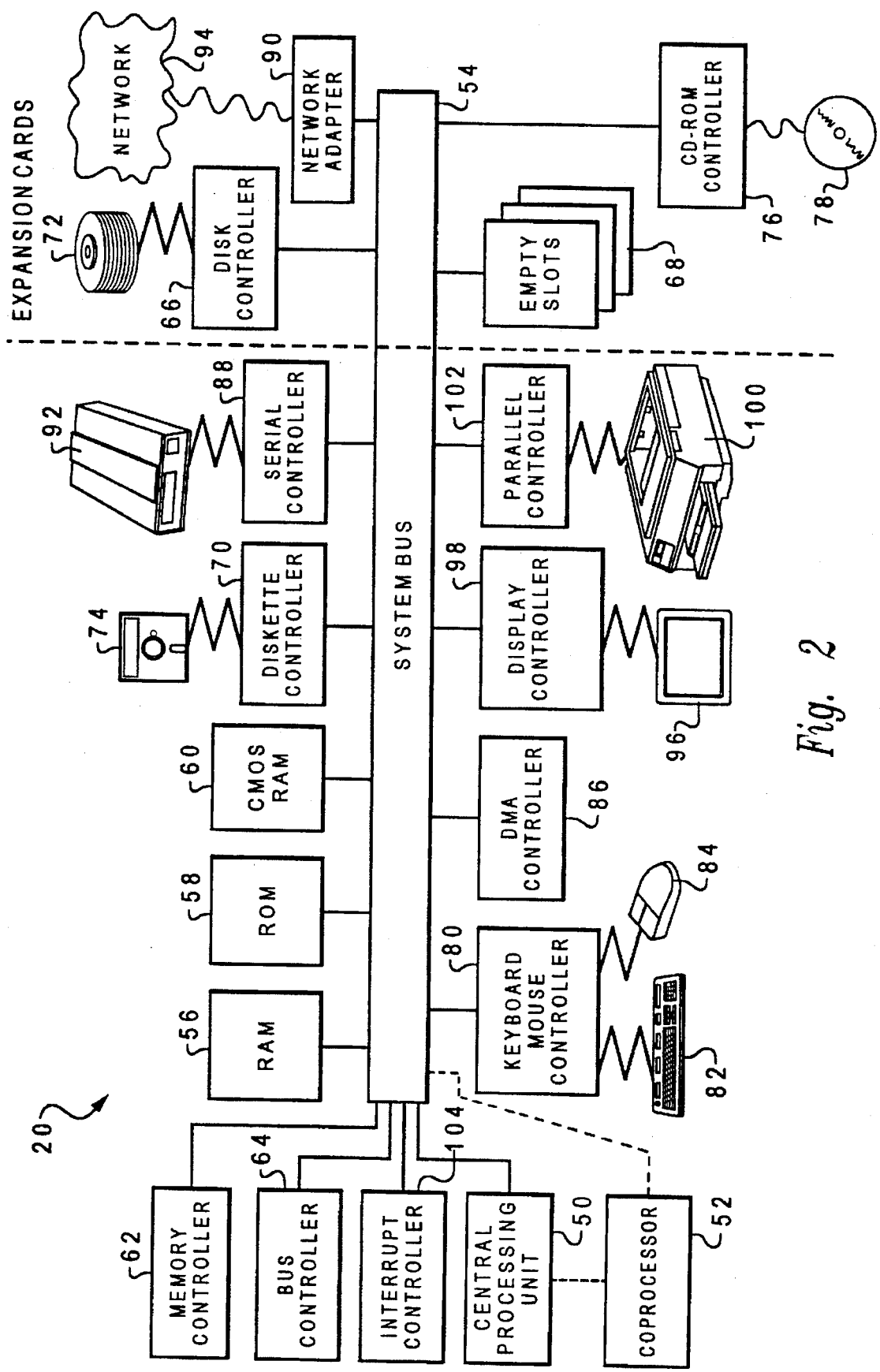
FIG. 2 is a high-level block diagram which further illustrates the major components of the data processing system of FIG. 1.

With reference now to FIG. 2, there is depicted a high-level block diagram which further illustrates the major components that may be included in data processing system 20 of FIG. 1. Data processing system 20 is controlled primarily by computer readable instructions, which may be in the form of software, wherever, or by whatever means such software is stored or accessed. Such software may be executed within central processing unit (CPU) 50 to cause data processing system 20 to do work. In many known workstations and personal computers, such as the personal computer sold by IBM under the trademark "PS/2," central processing unit 50 is implemented by a single-chip CPU called a microprocessor. Examples of such microprocessors include the microprocessor sold under the trademark "PENTIUM" by Intel Corporation and the microprocessor sold under the trademark "PowerPC" by International Business Machines Corporation.

Coprocessor 52 is an optional processor, distinct from main CPU 50, that performs additional functions or assists CPU 50. One common type of coprocessor is the floating-point coprocessor, also called a numeric or math coprocessor, which is designed to perform numeric calculations faster and better than general-purpose CPU 50. Recently, however, the functions of many coprocessors have been incorporated into more powerful single-chip microprocessors.

CPU 50 fetches, decodes, and executes instructions, and transfers information to and from other resources via the computer's main data-transfer path, system bus 54. Such a system bus connects the components in data processing system 20 and defines the medium for data exchange. System bus 54 typically includes data lines for sending data, address lines for sending addresses, and control lines for sending interrupts and for operating the system bus. An example of such a system bus is the PCI (Peripheral Component Interconnect) bus and the bus sold under the trademark "Micro Channel Architecture" by IBM. The Micro Channel Architecture provides a function called bus arbitration that regulates access to the bus by extension cards, controllers, and CPU 50. Devices that attach to the Micro Channel and arbitrate to take over the bus are called bus masters. Bus master support also allows multiprocessor configurations of the Micro Channel to be created by the 51 addition of bus master adapters containing a processor and its support chips.

Memory devices coupled to system bus 54 include random access memory (RAM) 56, read only memory (ROM) 58, and nonvolatile memory 60. Such memories include circuitry that allows information to be stored and retrieved. ROMs contain stored data that cannot be modified. Data stored in RAM can be read or changed by CPU 50 or other hardware devices. Nonvolatile memory is memory that does not lose data when power is removed from it. Nonvolatile memories include ROM, EPROM, flash memory, bubble memory, or battery-backed CMOS RAM. As shown in FIG. 2, such battery-backed CMOS RAM may be utilized to store system configuration information.

Access to RAM 56, ROM 58, and nonvolatile memory 60 may be controlled by memory controller 62 and bus controller 64. Memory controller 62 may provide an address translation function that translates virtual addresses into physical addresses as instructions are executed. Memory controller 62 may also provide a memory protection function that isolates processes within the system and isolates system processes from user processes. Thus, a program running in user mode can access only memory mapped by its own process virtual address space; it cannot access memory within another process's virtual address space unless memory sharing between the processes has been set up.

An expansion card or expansion board is a circuit board that includes chips and other electronic components connected in a circuit that adds functions or resources to the computer. Typical expansion cards add memory, disk-drive controllers 66, video support, parallel and serial ports, and internal modems. For laptop, palmtop, and other portable computers, expansion cards usually take the form of PC Cards, which are credit card-size devices designed to plug into a slot in the side or back of a computer. An example of such a slot is the PCMCIA slot (Personal Computer Memory Card International Association) which defines type I, II and III card slots. Thus, empty slots 68 may be used to receive various types of expansion cards or PCMCIA cards.

Disk controller 66 and diskette controller 70 both include special-purpose integrated circuits and associated circuitry that direct and control reading from and writing to a hard disk drive 72 and a floppy disk or diskette 74, respectively. Such disk controllers handle tasks such as positioning read/write head, mediating between the drive and the microprocessor, and controlling the transfer of information to and from memory. A single disk controller may be able to control more that one disk drive.

CD-ROM controller 76 may be included in data processing 20 for reading data from CD-ROMs 78 (compact disk read-only memory). Such CD-ROMs use laser optics rather than magnetic means for reading data.

Keyboard mouse controller 80 is provided in data processing system 20 for interfacing with keyboard 82 and a pointing device, such as mouse 84. Such pointing devices are typically utilized to control an on-screen element, such as a cursor, which may take the form of an arrow having a hot spot that specifies the location of the pointer when the user presses a mouse button. Other pointing devices include the graphics tablet, the stylus, the light pen, the joystick, the puck, the trackball, the trackpad and the pointing device sold under the trademark "TrackPoint" by IBM.

Direct memory access (DMA) controller 86 may be used to provide a memory access that does not involve CPU 50. Such memory accesses are typically employed for data transfer directly between memory and an "intelligent" peripheral device, such as between memory 56 and disk controller 66.

Communication between data processing system 20 and other data processing systems may be facilitated by serial controller 88 and network adaptor 90, both of which are coupled to system bus 54. Serial controller 88 is utilized to transmit information between computers, or between a computer and peripheral devices, one bit at a time over a single line. Serial communications can be synchronous (controlled by some time standard such as a clock) or asynchronous (managed by the exchange of control signals that govern the flow of information). Examples of serial communications standards include the RS-232 interface and the RS-422 interface.

As illustrated, such a serial interface may be utilized to communicate with modem 92. A modem is a communications device that enables a computer to transmit information over a standard telephone line. Modems convert digital computer signals to analog signals suitable for communication over telephone lines. Modem 92 may be utilized to connect data processing system 20 to an on-line information service, such as the information service provided under the service mark "PRODIGY" by IBM and Sears. Such on-line service providers may offer software which may be downloaded into data processing system 20 via modem 92. Modem 92 may provide a connection to other sources of software, such as a server, an electronic bulletin board, and the Internet or World Wide Web.

Network adaptor 90 may be used to connect data processing system 20 to a local area network 94. Network 94 may provide computer users with means of communicating and transferring software and information electronically. Additionally, network 94 may provide distributed processing, which involves several computers and the sharing of workloads or cooperative efforts in performing a task.

Display 96, which is controlled by display controller 98, is used to display visual output generated by data processing system 20. Such visual output may include text, graphics, animated graphics, and video. Display 96 may be implemented with a CRT-based video display, an LCD-based flat-panel display, or a gas plasma-based flat-panel display. Display controller 98 includes electronic components required to generate a video signal that is sent to display 96.

Printer 100 may be coupled to data processing system 20 via parallel controller 102. Printer 100 is used to put text or a computer-generated image on paper or on another medium, such as a transparency. Other types of printers may include an imagesetter, a plotter, or a film recorder.

Parallel controller 102 is used to send multiple data and control bits simultaneously over wires connected between system bus 54 and another parallel communication device, such as printer 100. The most common parallel interface is the Centronics interface.

During data processing operations, the various devices connected to system bus 54 may generate interrupts which are processed by interrupt controller 104. An interrupt is a request for attention from CPU 50 that can be passed to CPU 50 by either hardware or software. An interrupt causes the microprocessor to suspend currently executing instructions, save the status of the work in progress, and transfer control to a special routine, known as an interrupt handler, that causes a particular set of instructions to be carried out. Interrupt controller 104 may be required to handle a hierarchy of interrupt priorities and arbitrate simultaneous interrupt requests. Interrupt controller 104 may also be used to temporally disable interrupts.

Figure 3:
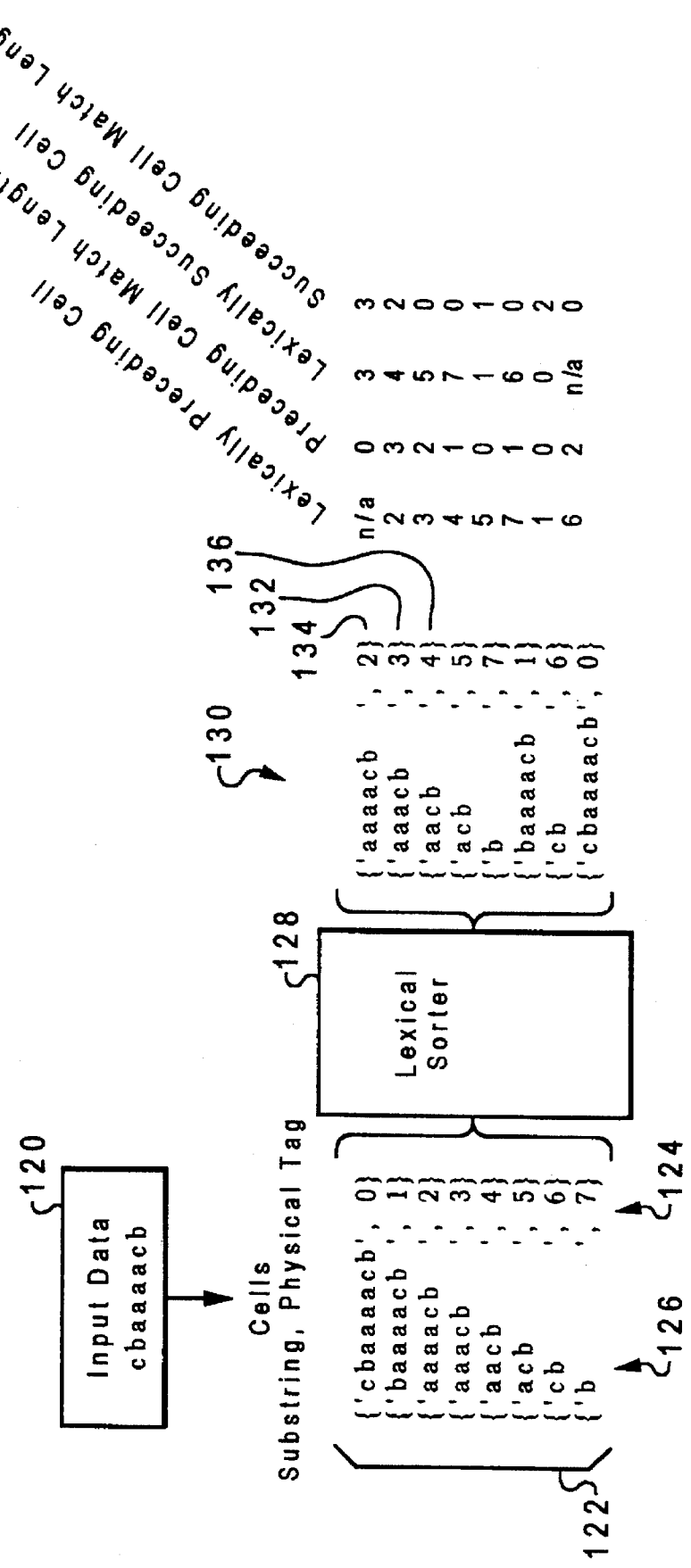
FIG. 3 is a high-level block diagram which illustrates the creation and sorting of data cells, and the analysis of such data cells, in accordance with the method and system of the present invention.

With reference now to FIG. 3, there is depicted a high-level block diagram which illustrates the creation and sorting of data cells, and the analysis of such data cells, in accordance with the method and system of the present invention. As illustrated, data block 120, which includes N bytes of data (N is greater than 1), is selected for data compression. Typically N is selected as 4096, or some other convenient power of 2, such as the size of a sector on a disk drive. However, in the example shown in FIG. 3, N is equal to 8 for the purpose of illustration. Bytes of data in data block 120 may be referenced in a physical order from left to right as byte(P) wherein P is an integer from 0 to 7.

From data block 120, a group of data structures or data cells 122 is created. Each data cell within the group includes physical tag 124 and substring 126. Physical tag 124 indicates a physical order in group of data cells 122. In the example illustrated, the cells in group of data cells 122 may be referenced as cell(P), wherein P is an integer from 0 to 7 (i.e., 0 to N).

The substring 126 in each cell(P) includes a string or sequence of bytes from data block 120 that extends from byte(P) to the lesser of byte(P+X) or byte(N−1), wherein X is a predetermined integer. In the example illustrated, X is equal to 7, which is N−1. Therefore, each substring 126 begins from byte(P) in data block 120 and extends to the last data byte in data block 120. Selecting a value for X that is less than N−1 may be useful to improve the size, cost, or speed of the sorter, without significantly reducing the overall data compression effectiveness.

Once group of data cells 122 has been created, group of data cells 122 is lexically sorted using lexical sorter 128. Such lexical sorting establishes a lexical order of the N cells in group of data cells 122 that is based upon the lexical value of substring 126 in each of the N cells. In other words, the group of data cells 122 is sorted alphabetically, or sorted based upon the numerical values of the bytes in substrings 126 in each data cell.

The output of lexical sorter 128 is shown as lexically sorted group of data cells 130. As is shown, substrings 126 in lexically sorted group of data cells 130 are in lexical or alphabetical order from top to bottom. Thus, a selected one of the data cells, except for the first data cell and the last data cell, has a lexically preceding cell and a lexically succeeding cell that are immediately adjacent to the selected cell in the lexically sorted group of data cells 130. For example, cell(3) 132 is lexically preceded by cell(2) 134 and lexically succeeded by cell(4) 136. The data in the columns to the right of each cell in lexically sorted group of data cells 130 shows the results of an analysis which locates lexically preceding and succeeding cells and determines the longest matching string length between the substring in the currently selected cell and substrings in lexically preceding and succeeding cells. Such a search for matching strings is performed byte-by-byte from the beginning of the substrings being compared. For example, cell(3) 132 is lexically preceded by cell(2) 134, which contains a matching string having a length of 3. Similarly, cell(3) 132 is lexically succeeded by cell(4) 136, which contains a matching string having a length of two. This type of information is used in the back-end encoding process described below.

Figure 4:
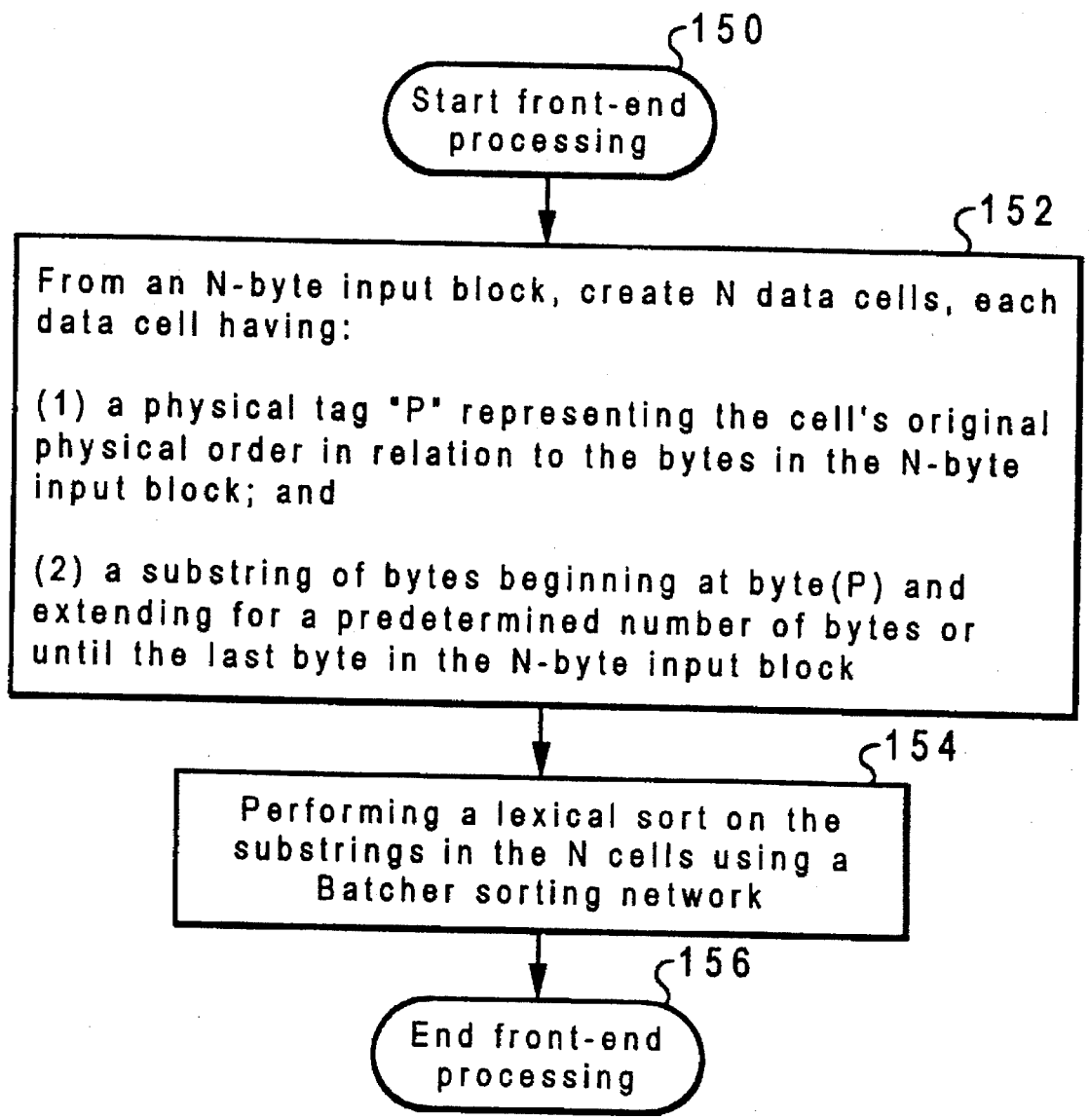
FIG. 4 depicts a high-level flowchart that illustrates the process of performing front-end processing for data compression in accordance with the method and system of the present invention.

With reference now to FIG. 4, there is depicted a high-level flowchart that illustrates the process of performing front-end processing for data compression, as shown in FIG. 3 in accordance with the method and system of the present invention. As illustrated front-end processing begins at block 150 and thereafter passes to block 152. The process then creates N data cells from an N-byte input block. Each of the N data cells includes: (1) a physical tag "P" representing the cell's original, physical order in relation to the data in the bytes in the N-byte input block; and (2) a substring of bytes beginning at byte(P) and extending for a predetermined number of bytes, or until the last byte in the N-byte input block.

Next, the process performs a lexical sort on the substrings in the N cells using a Batcher sorting network. A sorting network is a device that can accept a number of unordered data or cells at multiple inputs, and deliver the same data or cells in sorted order at multiple outputs. Such sorting is typically accomplished by a suitable internal combination of switches actuated by comparison elements, connected ingeneously to route each data cell to the correct output based on a series of comparisons of a cell's contents with the contents of other input cells. A Batcher sorting network uses a particularly elegant and efficient arrangement of switching elements which permits it to sort n cells using $O(\log^2(n))$ pipelineable stages. For more information about Batcher sorting networks, see *Gigabit Networking* by Craig Partridge, published by Addison-Wesley Publishing Company, Inc., Copyright 1994.

Front-end processing is then terminated, as depicted at block 156.

While the lexical sorter used in block 154 of FIG. 4 is described as a Batcher sorting network, other lexical sorters may be used that have speed, size, cost, and complexity similar to those of the Batcher sorting network. For example, an odd-even merge sort network can be used to achieve a slight decrease in gate count.

Figure 5:
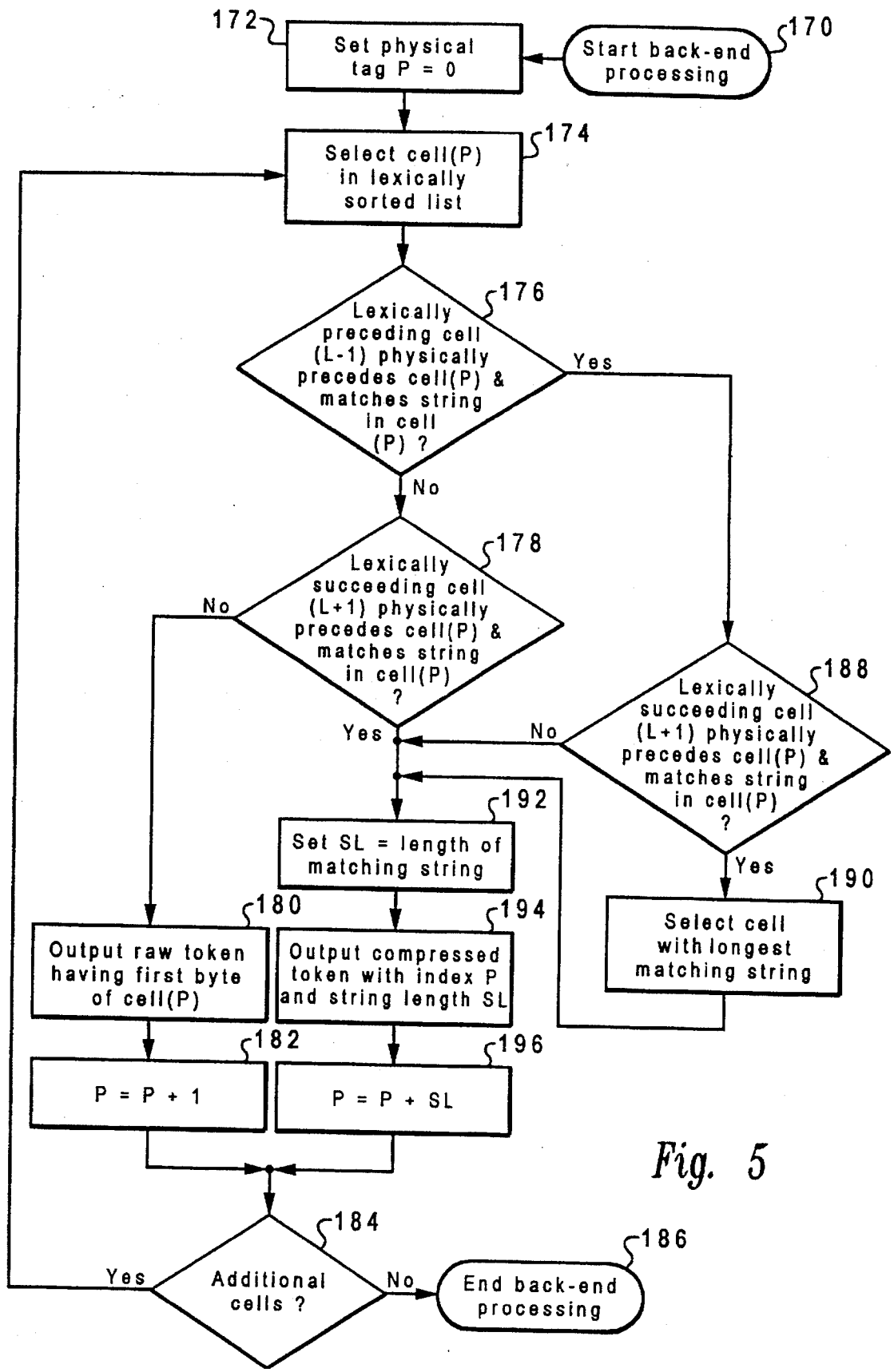
FIG. 5 depicts a high-level flowchart that illustrates the process of encoding data in a back-end process in accordance with the method and system of the present invention.

With reference now to FIG. 5, there is depicted a high-level flowchart that illustrates the process of encoding data in a back-end process in accordance with the method and system of the present invention. As illustrated, the back-end processing begins at block 170 and thereafter passes to block 172 wherein physical tag "P" is set equal to 0. Thereafter, cell(P) is selected in the lexically sorted list, such as lexically sorted group of data cells 130 in FIG. 3. Note that cell(P) is not necessarily the first cell in the lexically sorted list—cell(P), at this point in the flowchart, is the cell with the physical tag equal to 0, which was the first cell created in block 152 of FIG. 4.

Next, the process determines whether or not the lexically preceding cell, represented as cell(L–1), physically precedes cell(P), and whether or not the substrings in cell(P) and cell(L–1) containing a matching string having a length greater than 1, as illustrated at block 176. If the lexically preceding cell(L–1) does not physically precede cell(P) and/or contain a matching string having a length greater than 1, the process passes to block 178. There, the process determines whether or not the lexically succeeding cell(L+1) physically precedes cell(P) and matches a string in cell(P) having a length greater than 1. If the lexically succeeding cell does not physically precede cell(P) and/or does not match a string in cell(P) having a length greater than 1, the process outputs a raw token that includes the first byte of cell(P) as depicted at block 180. Thereafter, the process increments P by 1 as depicted at block 182 and determines whether or not additional cells need processing in the lexically sorted group of data cells, as illustrated at block 184. If additional cells need processing, the process continues at block 174 with a newly selected cell(P). If all the cells have been processed, back-end processing ends as depicted at block 186.

Referring again to block 176, if the lexically preceding cell physically precedes selected cell(P) and contains a string having a length greater than 1 that matches the string in cell(P), the process examines the lexically succeeding cell, cell(L+1), to determine whether or not it physically precedes cell(P), and examines cell(L+1) to determine whether or not a string in that cell having a length greater than 1 matches the string in cell(P), as illustrated at block 188. If both the lexically preceding and lexically succeeding cells physically precede cell(P), and both contain strings having lengths greater than 1 that match the string in cell(P), the process selects the cell with the longest matching string, as depicted at block 190.

Once the cell with the longest matching string is selected, or once it is determined that only the lexically preceding cell meets these conditions, the process sets the variable "SL" equal to the length of the matching string, as illustrated at block 192. Thereafter, the process outputs a compressed token with the index equal to P and the string length equal to SL, as depicted at block 194.

Next, the process adds string length SL to P as illustrated at block 196. This causes several physical cells to be skipped during back-end processing because a compressed string token was output as depicted in block 194. Next, the process determines whether there are additional cells to be processed, as depicted at block 184. If additional cells are available for processing, the process continues at block 174, and if additional cells are not available for processing, the process ends back-end processing as depicted at block 186.

With reference now to FIG. 6, there is depicted pseudocode for encoding a block of data in accordance with the method and system of the present invention. This figure sets forth the type of code necessary to select a longest matching sequence from a lexically preceding or succeeding cell that physically precedes a selected cell, as described in FIG. 5. The pseudocode is shown on the left, and the output resulting from executing the pseudocode is shown on the right side of the figure. Raw tokens are represented by the letter "r" and compressed tokens are represented by the letter "c."

Figure 7:
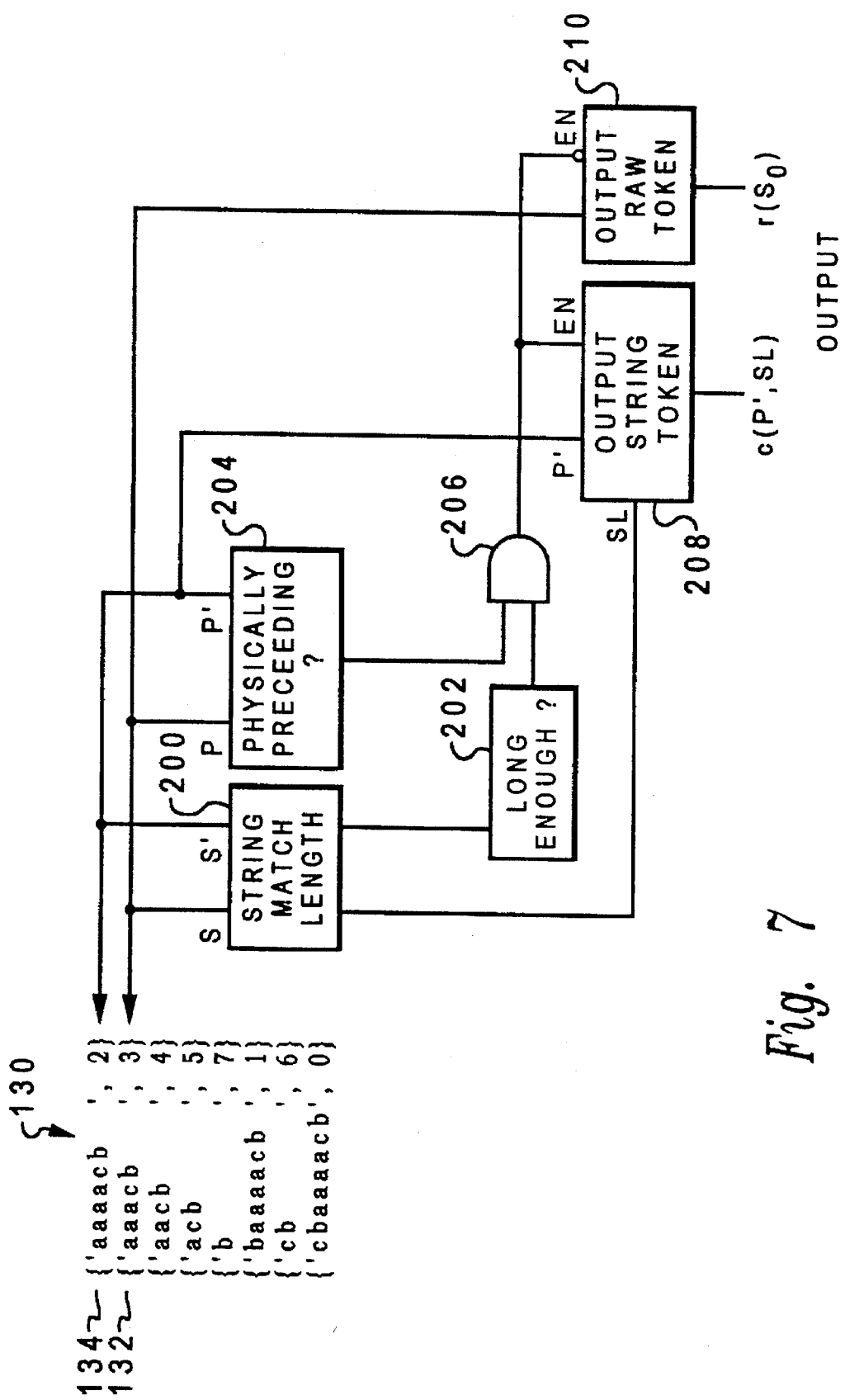
FIG. 7 is a high-level block diagram that depicts data flow in the process of encoding data in accordance with the method and system of the present invention.

With reference now to FIG. 7 there is depicted a high-level block diagram that depicts data flow during the process of encoding data in a back-end process in accordance with the method and system of the present invention. As illustrated, lexically sorted group of data cells 130 is shown with cell(3) 132 selected for back-end processing. In the example shown in FIG. 7, the selected cell(3) 132, is compared to only the lexically preceding cell, which is cell(2) 134 in this example.

String comparator 200 receives substrings 126 from cell(3) 132 and cell(2) 134 and determines the length of a string that matches, when compared on a byte-to-byte basis from the first character in each of the substrings. In the comparison illustrated in the example of FIG. 7, the length of matching strings is equal to 3.

This length of a string that matches strings in the two cells is input to block 202 to determine whether or not the matching string length is long enough. In this example, a string that is considered long enough is a string that has a length greater than one.

The physical tags 124 from both the selected cell, cell(3) 132, and a lexically preceding cell, cell(2) 134, are input into physical tag comparator 204. Physical comparator 204 determines whether or not the lexically preceding cell, cell(2) 134, physically precedes selected cell(3) 132. In this example, the lexically preceding cell does physically precede the selected cell because the physical tag of the lexically preceding cell(2), is less than the physical tag of the selected cell(3).

AND gate 206 receives Boolean inputs from block 202 and physical tag comparator 204. In this example, both inputs are true because the string match length is greater than 1 and the lexically preceding cell physically precedes the selected cell. Therefore, the output of AND gate 206 is true so that logic circuit 208 is enabled and logic circuit 210 is not enabled.

Logic circuit 208 receives a matching string length from block 200 and a physical tag 124 from the lexically preceding cell, cell(2) 134. From these inputs, logic circuit 208 creates a compressed token with index P' taken from cell(2) 134 and string length, SL, from block 200.

If the matching string length was not long enough as determined by block 202 and/or the lexically preceding cell did not physically precede the selected cell, the output of AND gate 206 would be false, and logic circuit 210 would be enabled. If this were the case, logic circuit 210 would receive the first byte of substring 126 from the selected cell, cell(3) 132, and create a raw token which is then sent to the output as part of a compressed data set.

Figure 8:
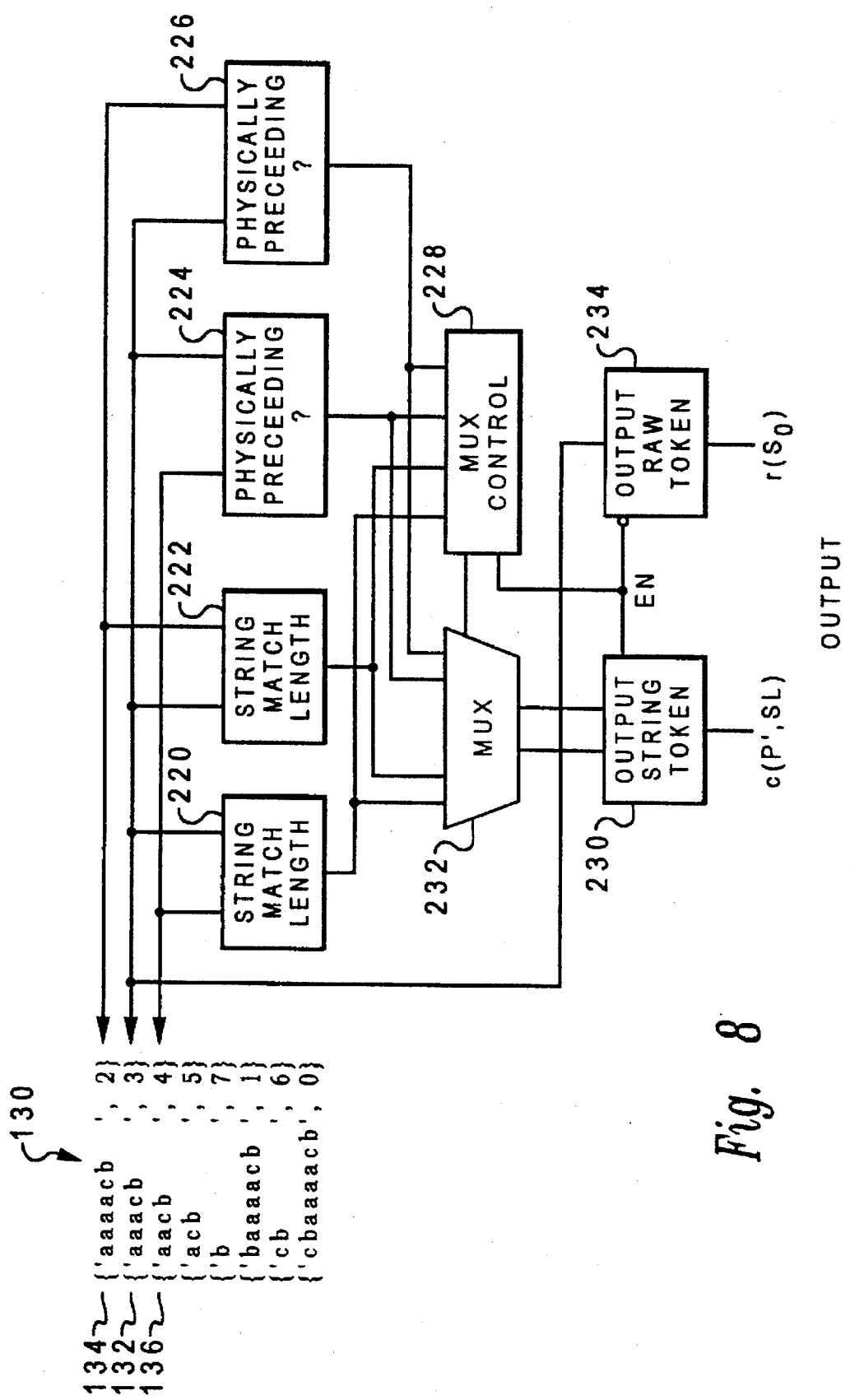
FIG. 8 depicts a high-level block diagram that illustrates data flow in another embodiment of the process of encoding data in accordance with the method and system of the present invention.

Finally, with reference to FIG. 8, there is depicted a high-level block diagram that illustrates data flow in another embodiment of the process of encoding data in accordance with the method and system of the present invention. In the example shown in FIG. 8, the lexically preceding cell and lexically succeeding cell are both compared to a selected cell to determine string match lengths and whether or not the cells physically precede the selected cell. String match lengths are determined by string comparators 220 and 222. Whether or not the cells physically precede the selected cell is determined by blocks 224 and 226. Mux control 228 selects the lexically preceding or succeeding cell that physically precedes the selected cell and has the longest matching string length. Once this cell has been selected in response to these conditions, mux control 228 enables logic circuit 230, and selects the appropriate inputs in mux 232. If these conditions are not met, mux control 228 enables logic circuit 234.

Logic circuit 230 receives the longest matching string length, SL, and the physical tag 124 belonging to the cell having the longest matching string, from the output of mux 232. In response to being enabled and receiving such inputs, logic circuit 230 creates a string token and sends such a string token to the output to become part of the compressed data set.

Logic circuit 234 receives the first byte from substring 126 in the selected cell(3) 132, and creates a raw token in response to being enabled by mux control 228. Such a raw token is sent to the output and becomes part of the compressed data set.

As indicated above, aspects of this invention pertain to specific "method functions" implementable on computer systems. In an alternate embodiment, the invention may be implemented as a computer program product for use with a computer system. Because some of the advantages of the present invention are a result of performing a sort operation as a parallel operation, such a computer system preferably includes multiple central processing units 50 or a special purpose coprocessor 52 connected to system bus 54, both of which may be used for performing a parallel sort operation as disclosed above. Those skilled in the art should readily appreciate that programs defining the functions of the present invention can be delivered to a computer in many forms, which include, but are not limited to: (a) information permanently stored on non-writable storage media (e.g. read only memory devices within a computer such as ROM 58 or CD-ROM disks 78 readable by a computer I/O attachment); (b) information alterably stored on writable storage media (e.g. floppy disks 74 and hard drives 72); or (c) information conveyed to a computer through communication media, such as network 94, and telephone networks, via modem 92. It should be understood, therefore, that such media, when carrying computer readable instructions that direct the method functions of the present invention, represent alternate embodiments of the present invention.

The foregoing description of a preferred embodiment of the invention has been presented for the purpose of illustration and description. It is not intended to be exhaustive or limit the invention to the precise form disclosed. Obvious modifications or variations are possible in light of the above teachings. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth, they are fairly, legally, and equitably entitled.

What is claimed is:

1. A method in a data processing system for efficiently compressing data, said method comprising the steps of:
   (a) selecting a block of N bytes in said data processing system, wherein N is greater than 1;
   (b) creating a group of N data cells, each of said cells having:
      (1) a physical tag, P, for indicating a physical order in said group, wherein each of said cells may be referenced as cell(P), wherein P is an integer from 0 to N−1, and
      (2) a substring, wherein said substring in said cell(P) includes a sequence of bytes from said block of N bytes extending from byte(P) to the lesser of byte (P+X) or byte(N−1), wherein X is a predetermined integer;
   (c) lexically sorting said group of N cells so that a lexical order of said N cells is established based upon the lexical value of said substring in each of said N cells;
   (d) identifying matching strings in said substrings of selected ones of said N cells in said lexically sorted group of N cells; and
   (e) encoding said block of N bytes utilizing said identified matching strings to produce a compressed data set, wherein said compressed data set is efficiently produced by identifying redundant information in said lexically sorted group of N cells.

2. The method in a data processing system for efficiently compressing data according to claim 1 wherein said step of identifying matching strings in said substrings of selected ones of said N cells in said lexically sorted group of N cells includes comparing lexically adjacent cells in said lexically sorted group of N cells to identify matching strings.

3. The method in a data processing system for efficiently compressing data according to claim 2 wherein said step of comparing lexically adjacent cells in said lexically sorted group of N cells to identify matching strings includes comparing a substring in a selected cell with a substring in a lexically preceding cell and a substring in a lexically succeeding cell to find one or more matching strings of bytes in said substrings.

4. The method in a data processing system for efficiently compressing data according to claim 1 wherein said steps of:
   (d) identifying matching strings in said substrings of selected ones of said N cells in said lexically sorted group of N cells; and (e) encoding said block of N bytes utilizing said identified matching strings to produce a compressed data set;

further include the steps of:

(f) selecting cell(P);

(g) selecting from a lexically preceding cell and a lexically succeeding cell relative to cell(P), a matching cell that (1) physically precedes said selected cell(P), and (2) includes a longest matching string of bytes in said substring of said matching cell that matches corresponding bytes from the beginning of said substring in said selected cell(P);

(h) if said matching cell includes said matching string of bytes having a length, L, greater than 1, outputting a compressed token having an index equal to physical tag, P, of said matching cell, and a length equal to L; and (i) if no matching cell is selected in step (g), outputting a raw token including a first character in the substring of said selected cell(P).

5. The method in a data processing system for efficiently compressing data according to claim 4 further including the steps of:

selecting a next cell(P); and repeating steps (g) through (i) until said block of N bytes is encoded to produce said compressed data set.

6. The method in a data processing system for efficiently compressing data according to claim 1 wherein said step of lexically sorting said group of N cells includes lexically sorting said group of N cells using a Batcher sorting network.

7. The method in a data processing system for efficiently compressing data according to claim 1 wherein said step of lexically sorting said group of N cells includes lexically sorting said group of N cells using a sorter that processes a plurality of cells per cycle in parallel.

8. The method in a data processing system for efficiently compressing data according to claim 1 wherein said step of identifying matching strings includes comparing substrings in a first selected cell with a substring in a second selected cell with a byte-by-byte comparison of corresponding bytes from the beginning of each substring.

9. A data processing system for efficiently compressing data comprising:

means for selecting a block of N bytes in said data processing system, wherein N is greater than 1;

means for creating a group of N data cells, each of said cells having:

(1) a physical tag, P, for indicating a physical order in said group, wherein each of said cells may be referenced as cell(P), wherein P is an integer from 0 to N−1, and (2) a substring, wherein said substring in said cell(P) includes a sequence of bytes from said block of N bytes extending from byte(P) to the lesser of byte (P+X) or byte(N−1), wherein X is a predetermined integer;

means for lexically sorting said group of N cells so that a lexical order of said N cells is established based upon the lexical value of said substring in each of said N cells;

means for identifying matching strings in said substrings of selected ones of said N cells in said lexically sorted group of N cells; and means for encoding said block of N bytes utilizing said identified matching strings to produce a compressed data set, wherein said compressed data set is efficiently produced by identifying redundant information in said lexically sorted group of N cells.

10. The data processing system for efficiently compressing data according to claim 9 wherein said means for identifying matching strings in said substrings of selected ones of said N cells in said lexically sorted group of N cells includes means for comparing lexically adjacent cells in said lexically sorted group of N cells to identify matching strings.

11. The data processing system for efficiently compressing data according to claim 10 wherein said means for comparing lexically adjacent cells in said lexically sorted group of N cells to identify matching strings includes means for comparing a substring in a selected cell with a substring in a lexically preceding cell and a substring in a lexically succeeding cell to find one or more matching strings of bytes in said substrings.

12. The data processing system for efficiently compressing data according to claim 9 wherein said:

means for identifying matching strings in said substrings of selected ones of said N cells in said lexically sorted group of N cells; and means for encoding said block of N bytes utilizing said identified matching strings to produce a compressed data set;

further include:

means for selecting cell(P);

means for selecting from a lexically preceding cell and a lexically succeeding cell relative to cell(P), a matching cell that (1) physically precedes said selected cell(P), and (2) includes a longest matching string of bytes in said substring of said matching cell that matches corresponding bytes from the beginning of said substring in said selected cell(P);

means for outputting a compressed token having an index equal to physical tag, P, of said matching cell, and a length equal to L in response to said matching cell including said matching string of bytes having a length, L, greater than 1; and means for outputting a raw token including a first character in the substring of said selected cell(P) in response to said lexically preceding and succeeding cells either physically succeeding said selected cell(P) or having a longest matching string of bytes with a length less than 2.

13. The data processing system for efficiently compressing data according to claim 12 further including means for selecting a next cell(P) in response to outputting either a raw token or a compressed token having a length L.

14. The data processing system for efficiently compressing data according to claim 9 wherein said means for lexically sorting said group of N cells includes a Batcher sorting network for lexically sorting said group of N cells.

15. The data processing system for efficiently compressing data according to claim 9 wherein said means for lexically sorting said group of N cells includes a sorter that processes a plurality of bytes per cycle in parallel.

16. The data processing system for efficiently compressing data according to claim 9 wherein said means for identifying matching strings includes means for comparing substrings in a first selected cell with a substring in a second selected cell with a byte-by-byte comparison of corresponding bytes from the beginning of each substring.

17. A computer program product comprising:

a computer usable medium having computer readable program code embodied on said medium for efficiently compressing data, said computer program product including:

computer readable program code means for selecting a block of N bytes in said data processing system, wherein N is greater than 1;

computer readable program code means for creating a group of N data cells, each of said cells having:
  (1) a physical tag, P, for indicating a physical order in said group, wherein each of said cells may be referenced as cell(P), wherein P is an integer from 0 to N−1, and
  (2) a substring, wherein said substring in said cell(P) includes a sequence of bytes from said block of N bytes extending from byte(P) to the lesser of byte (P+X) or byte(N−1), wherein X is a predetermined integer;

computer readable program code means for lexically sorting said group of N cells so that a lexical order of said N cells is established based upon the lexical value of said substring in each of said N cells;

computer readable program code means for identifying matching strings in said substrings of selected ones of said N cells in said lexically sorted group of N cells; and computer readable program code means for encoding said block of N bytes utilizing said identified matching strings to produce a compressed data set, wherein said compressed data set is efficiently produced by identifying redundant information in said lexically sorted group of N cells.

18. The computer program product for efficiently compressing data according to claim 17 wherein said computer readable program code means for identifying matching strings in said substrings of selected ones of said N cells in said lexically sorted group of N cells includes computer readable program code means for comparing lexically adjacent cells in said lexically sorted group of N cells to identify matching strings.

19. The computer program product for efficiently compressing data according to claim 18 wherein said computer readable program code means for comparing lexically adjacent cells in said lexically sorted group of N cells to identify matching strings includes computer readable program code means for comparing a substring in a selected cell with a substring in a lexically preceding cell and a substring in a lexically succeeding cell to find one or more matching strings of bytes in said substrings.

20. The computer program product for efficiently compressing data according to claim 17 wherein said:
  computer readable program code means for identifying matching strings in said substrings of selected ones of said N cells in said lexically sorted group of N cells; and
  computer readable program code means for encoding said block of N bytes utilizing said identified matching strings to produce a compressed data set;
further include:
  computer readable program code means for selecting cell(P);
  computer readable program code means for selecting from a lexically preceding cell and a lexically succeeding cell relative to cell(P), a matching cell that (1) physically precedes said selected cell(P), and (2) includes a longest matching string of bytes in said substring of said matching cell that matches corresponding bytes from the beginning of said substring in said selected cell(P);
  computer readable program code means for outputting a compressed token having an index equal to physical tag, P, of said matching cell, and a length equal to L in response to said matching cell including said matching string of bytes having a length, L, greater than 1; and
  computer readable program code means for outputting a raw token including a first character in the substring of said selected cell(P) in response to said lexically preceding and succeeding cells either physically succeeding said selected cell(P) or having a longest matching string of bytes with a length less than 2.

21. The computer program product for efficiently compressing data according to claim 17 wherein said computer readable program code means for lexically sorting said group of N cells includes computer readable program code means for lexically sorting said group of N cells using a sorter that processes a plurality of cells in parallel.

22. The computer program product for efficiently compressing data according to claim 17 wherein said computer readable program code means for identifying matching strings includes computer readable program code means for comparing substrings in a first selected cell with a substring in a second selected cell with a byte-by-byte comparison of corresponding bytes from the beginning of each substring.

* * * * *